(12) United States Patent
Cheng et al.

(10) Patent No.: US 12,074,036 B2
(45) Date of Patent: Aug. 27, 2024

(54) MULTI-LAYERED POLYSILICON AND OXYGEN-DOPED POLYSILICON DESIGN FOR RF SOI TRAP-RICH POLY LAYER

(71) Applicant: Taiwan Semiconductor Manufacturing Company, Ltd., Hsin-Chu (TW)

(72) Inventors: Yu-Hung Cheng, Tainan (TW); Cheng-Ta Wu, Shueishang Township (TW); Chen-Hao Chiang, Jhongli (TW); Alexander Kalnitsky, San Francisco, CA (US); Yeur-Luen Tu, Taichung (TW); Eugene Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 95 days.

(21) Appl. No.: 17/519,765

(22) Filed: Nov. 5, 2021

(65) Prior Publication Data

US 2022/0059364 A1 Feb. 24, 2022

Related U.S. Application Data

(62) Division of application No. 16/567,290, filed on Sep. 11, 2019, now Pat. No. 11,171,015.

(51) Int. Cl.
*H01L 21/322* (2006.01)
*H01L 21/762* (2006.01)
(Continued)

(52) U.S. Cl.
CPC ...... *H01L 21/3226* (2013.01); *H01L 21/7624* (2013.01); *H01L 23/66* (2013.01); *H01L 29/0649* (2013.01); *H01L 29/34* (2013.01)

(58) Field of Classification Search
CPC . H01L 21/3226; H01L 21/7624; H01L 23/66; H01L 29/0649; H01L 29/34
(Continued)

(56) References Cited

U.S. PATENT DOCUMENTS 4,755,865 A * 7/1988 Wilson .................... H01L 29/04
257/65
5,091,330 A * 2/1992 Cambou ........... H01L 21/76264
148/DIG. 12
(Continued)

FOREIGN PATENT DOCUMENTS

CN 1351760 * 5/2002
CN 104409345 * 3/2015
(Continued)

OTHER PUBLICATIONS

Peirson, Brad. "Comparison of the ASTM Comparative Chart Method and the Mean Line Intercept Method in Determining the Effect of Solidification Rate on the Yield Strength of AA5182." School of Engineering Grand Valley State University, published Jul. 12, 2005.
(Continued)

*Primary Examiner* — Sheng-Bai Zhu
(74) *Attorney, Agent, or Firm* — Eschweiler & Potashnik, LLC

(57) ABSTRACT

In some embodiments, the present disclosure relates to a high-resistivity silicon-on-insulator (SOI) substrate, including a first polysilicon layer arranged over a semiconductor substrate. A second polysilicon layer is arranged over the first polysilicon layer, and a third polysilicon layer is arranged over the second polysilicon layer. An active semiconductor layer over an insulator layer may be arranged over
(Continued)

the third polysilicon layer. The second polysilicon layer has an elevated concentration of oxygen compared to the first and third polysilicon layers.

20 Claims, 10 Drawing Sheets

(51) Int. Cl.
*H01L 23/66* (2006.01)
*H01L 29/06* (2006.01)
*H01L 29/34* (2006.01)

(58) Field of Classification Search
USPC .......................................................... 257/506
See application file for complete search history.

(56) References Cited

U.S. PATENT DOCUMENTS

| | | | | |
|---|---|---|---|---|
| 5,612,558 | A | * | 3/1997 | Harshfield ........ H01L 21/76897 |
| | | | | 257/E21.507 |
| 2002/0130330 | A1 | | 9/2002 | Kim et al. |
| 2012/0001267 | A1 | * | 1/2012 | Lee ..................... H01L 29/4236 |
| | | | | 257/E27.06 |
| 2013/0207175 | A1 | | 8/2013 | Sakamoto |
| 2014/0138758 | A1 | | 5/2014 | Jozaki et al. |
| 2016/0300729 | A1 | * | 10/2016 | Goktepeli ............... H01L 29/78 |
| 2017/0103913 | A1 | * | 4/2017 | Dutartre .............. H01L 21/0245 |
| 2017/0352688 | A1 | * | 12/2017 | Lee ................... H01L 21/02107 |
| 2020/0144316 | A1 | * | 5/2020 | Kim .................. H01L 27/14689 |

FOREIGN PATENT DOCUMENTS

| | | | |
|---|---|---|---|
| CN | 110352484 | * | 12/2022 |
| JP | H05267665 | * | 10/1993 |
| JP | 2000164861 | * | 6/2000 |
| KR | 100265939 | * | 11/2000 |
| KR | 20140043021 | * | 4/2014 |
| WO | WO 2012049865 | * | 4/2012 |

OTHER PUBLICATIONS

Applied Materials. "CENTURA EPI 200MM." The date of publication is unknown. Retrieved online on Jun. 10, 2019 from www.appliedmaterials.com/products/centura-epi-200mm.
Lehto, Pauli. "Characterization of average grain size and grain size distribution." Published Dec. 28, 2016.
Wikipedia.org "Doping (semiconductor)." Published on Mar. 12, 2019.
Dobkin, Daniel. "SiO2: Properties and Applications." Published in 2016. Retrieved from http://www.enigmatic-consulting.com/semiconductor_processing/CVD_Fundamentals/films/SiO2_properties.html.
Niknejad, Ali M. "Lecture 8: Distortion Metrics." University of California, Berkeley. Published in 2005.
EverythingRF.com. "New Collaboration to Develop Next-Generation Communication Systems on RF-SOI." Published on Jun. 17, 2015.
SOITEC. "SOI for RF Front-End Modules." Published in 2016.
Lapedus, Mark. "RF SOI Wars Begin." Semiconductor Engineering. Published May 17, 2018.
Ali, Khaled Ben."Substrate-Related RF Performance of Trap-Rich High-Resistivity SOI Wafers." Universite catholique de Louvain. Published Jun. 2014.
Applied Materials. "Thick Epitaxial Silicon Enhances Perfomance of Power and MEMS Devices." Published Jul. 2014.
Non-Final Office Action dated Jan. 26, 2021 for U.S. Appl. No. 16/567,290.
Final Office Action dated May 7, 2021 for U.S. Appl. No. 16/567,290.
Notice of Allowance dated Jul. 7, 2021 for U.S. Appl. No. 16/567,290.

* cited by examiner

MULTI-LAYERED POLYSILICON AND OXYGEN-DOPED POLYSILICON DESIGN FOR RF SOI TRAP-RICH POLY LAYER

REFERENCE TO RELATED APPLICATION

This Application is a Divisional of U.S. application Ser. No. 16/567,290, filed on Sep. 11, 2019, the contents of which are hereby incorporated by reference in their entirety.

BACKGROUND

Integrated circuits (ICs) have traditionally been formed on bulk semiconductor substrates. In recent years, semiconductor-on-insulator (SOI) substrates have emerged as an alternative to bulk semiconductor substrates. An SOI substrate comprises a semiconductor substrate, an insulator layer overlying semiconductor substrate, and a device layer overlying the insulator layer. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
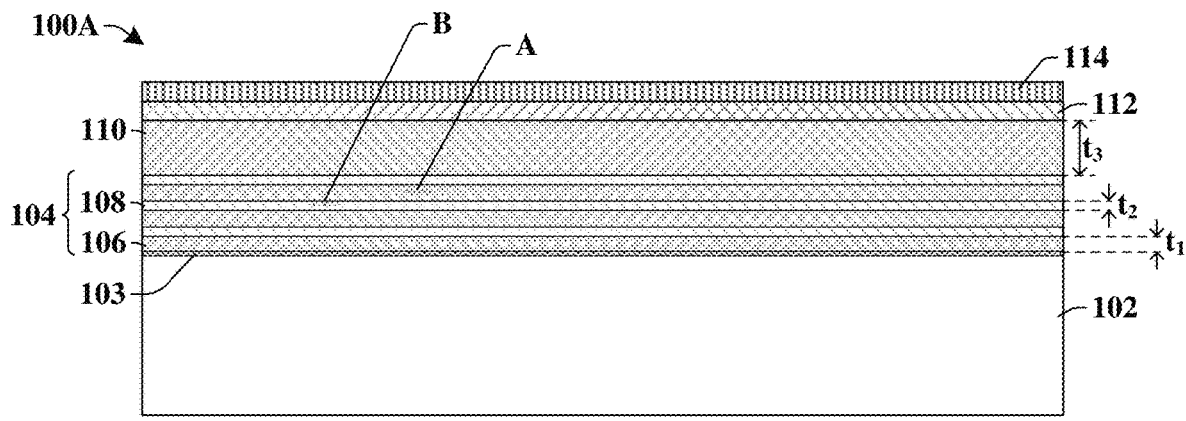
FIG. 1A illustrates a cross-sectional view of some embodiments of a high-resistivity silicon-on-insulator (SOI) substrate comprising layers of polysilicon and oxygen-doped polysilicon between an insulator and a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicon-on-insulator (SOI) substrates are often used for radio frequency (RF) applications. For example, an SOI substrate for an RF application may comprise an insulator layer disposed over a semiconductor substrate that has a high resistivity, and a device layer over the insulator layer. The device layer may comprise a semiconductor material and embedded semiconductor devices such as transistors, inductors, and/or MEMS devices, for example.

Since the semiconductor substrate is typically silicon, the semiconductor substrate may suffer from parasitic surface conduction (PSC). Fixed charge in the insulator layer attracts free charge carriers in the semiconductor substrate, thereby creating a low-resistivity region along a top surface of the semiconductor substrate that is meant to have a high resistivity to reduce RF losses and crosstalk between different devices in the device layer. For example, RF signals (e.g., from different devices in the device layer) may induce the formation of eddy currents in the low-resistivity region. The eddy currents may dissipate the RF signals and lead to RF losses. Further, the eddy currents may reflect the RF signals, thereby increasing crosstalk and reducing linearity (e.g., increasing second/third harmonic distortions).

Therefore, in some RF SOI substrates, a trap-rich polysilicon layer is disposed between the insulator and the semiconductor substrate to prevent free charge carriers from concentrating the semiconductor substrate by trapping free charge carriers in grain boundaries of the trap-rich polysilicon layer. To increase the effectiveness of trap-rich polysilicon layer in trapping free charge carriers, an average grain size of the trap-rich polysilicon layer may be reduced to increase the number of grain boundaries by adjusting parameters of forming the trap-rich polysilicon layer. However, even with smaller grain sizes, PSC may still be present in the semiconductor substrate.

Various embodiments of the present application are directed towards embedding layers of oxygen-doped polysilicon between layers of polysilicon. In some embodiments, a layer of polysilicon is formed over a native oxide on the semiconductor substrate in a chamber. Then, a low concentration of oxygen is introduced into the chamber and oxygen diffuses into a top surface of the layer of polysilicon to form a thin layer of the oxygen-doped polysilicon on the layer of polysilicon. The aforementioned steps may be repeated to increase the effectiveness of the oxygen-doped polysilicon in reducing the PSC effect in the semiconductor substrate. The oxygen-doped polysilicon layers may have a smaller average grain size than the polysilicon layers, thereby providing more grain boundaries to trap free charge carriers. Further, by introducing oxygen in a polysilicon structure, dangling bonds are formed, which may capture the free charge carriers. Thus, the oxygen-doped polysilicon layers provide more mechanisms to trap free charge carriers, thereby reducing the PSC effect in the semiconductor substrate. By reducing the effects of PSC, crosstalk, RF losses, and second/third harmonic distortions, for example, are mitigated.

FIG. 1A illustrates a cross-sectional view 100A of some embodiments of a high resistivity silicon-on-insulator (SOI) substrate having multiple layers of oxygen-doped polysilicon.

The high resistivity SOI substrate in the cross-sectional view 100A includes a semiconductor substrate 102. In some embodiments, the semiconductor substrate 102 has a low doping concentration to increase the resistivity of the semiconductor substrate 102, wherein the doping concentration is in a range of between approximately $10^{10}$ atoms per cubic centimeters and approximately $10^{11}$ atoms per cubic centimeters. In some embodiments, a native oxide layer 103 is arranged over the semiconductor substrate 102. A multi-layer polysilicon structure 104 is arranged over the native oxide layer 103. The multi-layer polysilicon structure 104 may comprise oxygen-doped polysilicon layers 108 alternatingly stacked with polysilicon layers 106, wherein the oxygen-doped polysilicon layers 108 have elevated concentrations of oxygen compared to the polysilicon layers 106. The oxygen-doped polysilicon layers 108 may comprise an atomic percent of oxygen that is in a range of between approximately 10 percent and approximately 20 percent. Thus, the oxygen-doped polysilicon layers 108 do not comprise a structure with a stoichiometry of silicon and oxygen equivalent to silicon dioxide. The oxygen in the oxygen-doped polysilicon layers 108 forms dangling bonds, which may contribute to trapping free charge carriers and prevent the free charge carriers from compromising the high resistivity in the semiconductor substrate 102.

In some embodiments, a cap polysilicon layer 110 may be arranged over a topmost layer of the oxygen-doped polysilicon layers 108. The oxygen-doped polysilicon layers 108 also have elevated concentrations of oxygen compared to the cap polysilicon layer 110. In some embodiments, each of the polysilicon layers 106 has a first thickness $t_1$ and each of the oxygen-doped polysilicon layers 108 has a second thickness $t_2$ that is smaller than the first thickness $t_1$. Further, in some embodiments, the cap polysilicon layer 110 has a third thickness $t_3$ that is greater than the first thickness $t_1$ and the second thickness $t_2$. In other embodiments, the third thickness $t_3$ may be about equal to the first thickness $t_1$.

In some embodiments, an insulator layer 112 may be arranged over the cap polysilicon layer 110, and a device layer 114 may be arranged over the insulator layer 112. In some embodiments, the device layer 114 may comprise RF devices within and/or over an active semiconductor layer (see, e.g., FIG. 2). In some embodiments, the high resistivity of the semiconductor substrate 102 may prevent crosstalk and RF losses between the RF devices in the device layer 114.

In the cross-sectional view 100A of FIG. 1A, the multi-layer polysilicon structure 104 comprises three of the oxygen-doped polysilicon layers 108 and three of the polysilicon layers 106. However, in other embodiments, the multi-layer polysilicon structure 104 may comprise up to fifty of the oxygen-doped polysilicon layers 108 and up to fifty of the polysilicon layers 106, wherein each of the polysilicon layers 106 is covered with one of the oxygen-doped polysilicon layers 108. Increasing a total number of the oxygen-doped polysilicon layers 108 in the multi-layer polysilicon structure 104 may increase the manufacturing time of the high resistivity SOI substrate, but may also increase the effectiveness of the multi-layer polysilicon structure 104 in trapping free charge carriers, thereby maintaining the high resistivity of the semiconductor substrate 102.

Figure 1B:
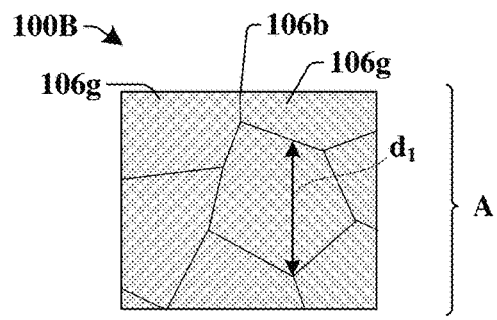
FIGS. 1B, 1C, 1D, and 1E illustrate schematics of some embodiments of grain structures for layers of polysilicon and oxygen-doped polysilicon having grain boundaries to trap free charge carriers.

FIG. 1B illustrates some embodiments of a schematic 100B of a grain structure in area A of the polysilicon layers 106 of FIG. 1A.

The schematic 100B of FIG. 1B microscopically shows that the polysilicon layers 106 of FIG. 1A have grains 106g separated by grain boundaries 106b. The grain boundaries 106b trap free charge carriers present between the insulator layer (112 of FIG. 1A) and the semiconductor substrate (102 of FIG. 1A) to maintain the high resistivity of the semiconductor substrate (102 of FIG. 1A), resulting in a more reliable device layer (114 of FIG. 1A). In some embodiments, average grain size is used to quantify the number of grain boundaries 106b in an area, such as area A, for example. In some embodiments, the area A is taken from a cross-section of the polysilicon layers 106 that is into and out of the page with respect to the cross-sectional view 100A of FIG. 1A. As average grain size decreases, the number of grain boundaries 106b increases. Average grain size may be calculated from a microstructure image using a variety of techniques, such as a linear intercept method, grain size per area method, and other software methods, for example. Nevertheless, average grain size may be quantified as an average grain size diameter. Further, many factors effect the average grain size of a material, such as processing methods, processing conditions (e.g., temperature, pressure, etc.), and composition, for example.

Figure 1C:
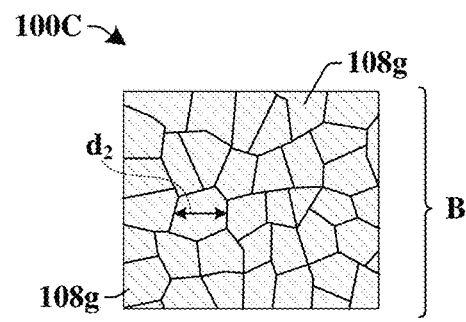
Figure 1D:
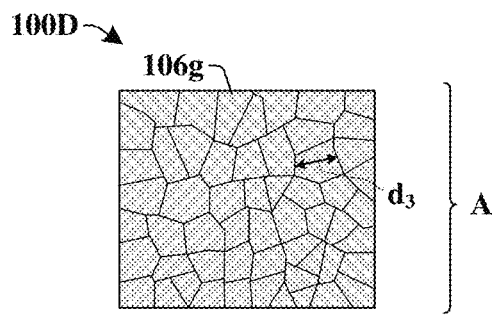
Figure 1E:
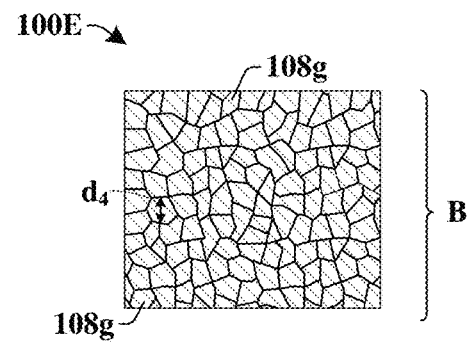

In some embodiments, the schematic 100B of FIG. 1B may have a first average grain size $d_1$ that is large (relative to average grain sizes in FIGS. 1C, 1D, and 1E). In some embodiments, the first average grain size $d_1$ of the polysilicon layers 106 may be in a range of between approximately 100 nanometers and approximately 200 nanometers.

FIG. 1C illustrates some embodiments of a schematic 100C of a grain structure in area B of the oxygen-doped polysilicon layers 108 of FIG. 1A formed on the polysilicon layers 106 having the grain structure in the schematic 100B of FIG. 1B.

It will be appreciated that the area A of FIGS. 1B and 1D is equal to the area B of Figs. C and E. In some embodiments, the area B is taken from a cross-section of the oxygen-doped polysilicon layers 108 that is into and out of the page with respect to the cross-sectional view 100A of FIG. 1A. In some embodiments, the oxygen-doped polysilicon layers 108 of FIG. 1A are formed by implanting oxygen into a top surface of one of the polysilicon layers 106 of FIG. 1A. In some embodiments, the oxygen-doped polysilicon layers 108 of FIG. 1A have grains 108g with a second average grain size $d_2$ that is less than the first average grain size $d_1$ of FIG. 1B. In some embodiments, the second average grain size $d_2$ may be, for example, in a range of between approximately 20 nanometers and approximately 40 nanometers. Thus, in some embodiments, doping the polysilicon layers 106 with oxygen may decrease average grain size from the first average grain size $d_1$ to the second average grain size $d_2$.

FIG. 1D illustrates some embodiments of a schematic 100D of another grain structure in area A of the polysilicon layers 106 of FIG. 1A.

The schematic 100D of FIG. 1D has grains 106g with a third average grain size $d_3$ that is less than the first average grain size $d_1$ of FIG. 1B. Because the schematic in FIG. 1B and FIG. 1D both comprise a same material, processing conditions (e.g., temperature, pressure, etc.) of the formation of the polysilicon layers 106 of FIG. 1A may contribute to the differences between the first average grain size $d_1$ and the third average grain size $d_3$. In some embodiments, the third average grain size $d_3$ may be in a range of between approximately 15 nanometers and approximately 22 nanometers.

FIG. 1E illustrates some embodiments of a schematic 100E of a grain structure in area B of the oxygen-doped polysilicon layers 108 of FIG. 1A formed on the polysilicon layers 106 having the grain structure in the schematic 100D of FIG. 1D.

The schematic 100E of FIG. 1E has grains 108g with a fourth average grain size $d_4$ that is less than the third average grain size $d_3$ of FIG. 1D. In some embodiments, the fourth average grain size $d_4$ of the oxygen-doped polysilicon layers 108 of FIG. 1A may be in a range of between, for example, approximately 1 nanometer and approximately 10 nanometers. Thus, in some embodiments, doping the polysilicon layers 106 with oxygen may decrease average grain size from the third average grain size $d_3$ to the fourth average grain size $d_4$. Further, in some embodiments, the fourth average grain size $d_4$ may be less than the second average grain size $d_2$ in FIG. 1C. Different factors may contribute to such a difference, such as oxygen concentration, processing conditions (e.g., temperature, pressure, etc.), and/or an initial grain size of the polysilicon layers 106 of FIG. 1A associated with the oxygen-doped polysilicon layers 108 of FIG. 1A.

Figure 2:
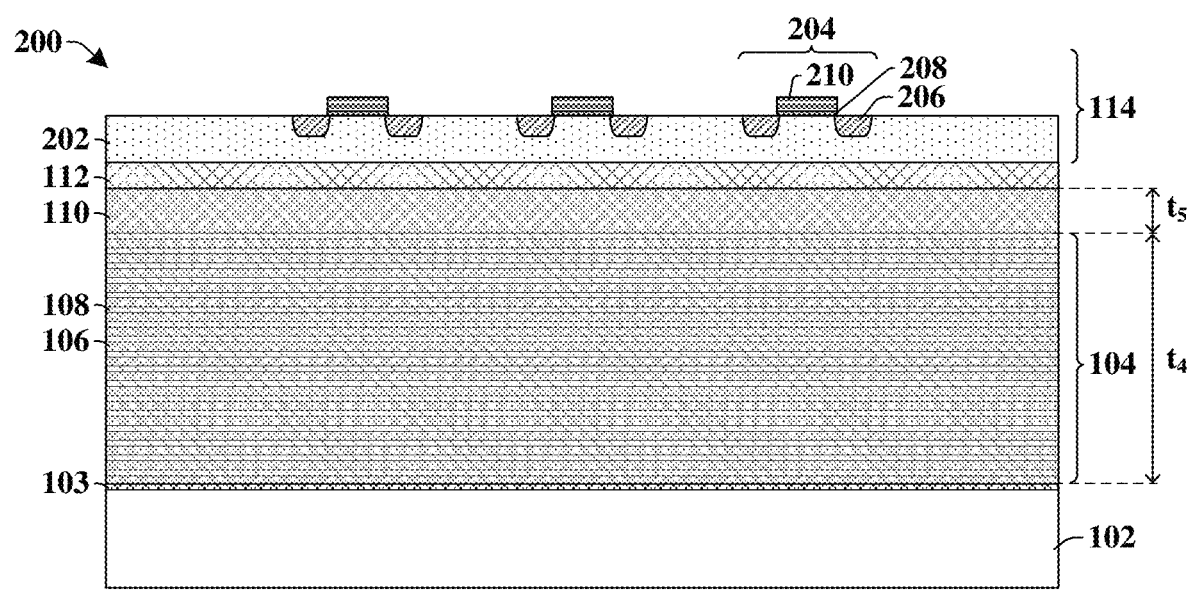
FIG. 2 illustrates a cross-sectional view of some additional embodiments of a high-resistivity SOI substrate comprising layers of polysilicon and oxygen-doped polysilicon between radio frequency (RF) devices and a semiconductor substrate.

FIG. 2 illustrates a cross-sectional view 200 of some other embodiments of a high resistivity silicon-on-insulator (SOI) substrate having multiple layers of oxygen-doped polysilicon.

The high resistivity SOI substrate in the cross-sectional view 200 includes the multi-layer polysilicon structure 104 with seventeen of the oxygen-doped polysilicon layers 108 and seventeen of the polysilicon layers 106. Each one of the polysilicon layers 106 is covered by each one of the oxygen-doped polysilicon layers 108, such that the multi-layer polysilicon structure 104 has an alternating structure of the oxygen-doped polysilicon layers 108 and the polysilicon layers 106. In some embodiments, the multi-layer polysilicon structure 104 may have a fourth thickness $t_4$, measured from a top surface of a topmost one of the oxygen-doped polysilicon layers 108 to a bottom surface of a bottommost one of the polysilicon layers 106. In some embodiments, the fourth thickness $t_4$ may be in a range of between, for example, approximately 180 nanometers and approximately 1 micrometer. The cap polysilicon layer 110 may have a fifth thickness $t_5$, and in some embodiments, the fifth thickness $t_5$ is dependent upon the fourth thickness $t_4$. For example, in some embodiments, a sum of the fourth thickness $t_4$ and the fifth thickness $t_5$ is approximately 2 micrometers. Therefore, in such embodiments, the fifth thickness $t_5$ may be in a range of between approximately 1.82 micrometers and approximately 1 micrometer.

In some embodiments, the device layer 114 that is over the insulator layer 112 may comprise an active semiconductor layer 202 and devices, such as, for example, transistors 204. Other devices in the active semiconductor layer 202 may include, for example, inductors or RF MEMS devices. The transistors 204 may each comprise source/drain regions 206 within the active semiconductor layer 202. A gate barrier layer 208 may be arranged between the source/drain regions 206 and above the active semiconductor layer 202. The transistors 204 may each further comprise a gate electrode 210 disposed over the gate barrier layer 208. In some embodiments, there are more than one transistor 204 in the device layer 114. The high resistivity SOI substrate in the cross-sectional view 200 is maintained using the multi-layer polysilicon structure 104 in order to trap free charge carriers, thereby mitigating crosstalk between the transistors 204 and RF losses, for example. By increasing the number of the oxygen-doped polysilicon layers 108 in the multi-layer polysilicon structure 104, more free charge carriers may be trapped in the multi-layer polysilicon structure 104, increasing the reliability of the transistors 204.

FIGS. 3-8 illustrate cross-sectional views 300-800 of some embodiments of a method of forming a high resistivity SOI substrate. Although FIGS. 3-8 are described in relation to a method, it will be appreciated that the structures disclosed in FIGS. 3-8 are not limited to such a method, but instead may stand alone as structures independent of the method.

Figure 3:
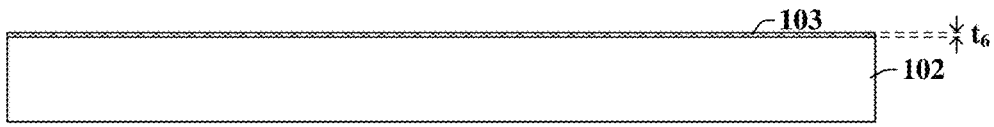
FIGS. 3-8 illustrate cross-sectional views of some embodiments of a method of forming layers of oxygen-doped polysilicon between layers of polysilicon to form a high-resistivity SOI substrate.

As shown in cross-sectional view 300 of FIG. 3, a semiconductor substrate 102 is provided. In some embodiments, the semiconductor substrate 102 may comprise silicon having a doping type (e.g., n-type or p-type) with a low doping concentration such that the semiconductor substrate 102 has a high resistivity. Thus, as the doping concentration decreases, the resistivity of the semiconductor substrate 102 increases. In some embodiments, the doping concentration is in a range of between approximately $10^{10}$ atoms per cubic centimeters and approximately $10^{11}$ atoms per cubic centimeters. In some embodiments, a native oxide layer 103 may be formed on the semiconductor substrate 102 as a residual effect of processing. The native oxide layer 103 may comprise silicon dioxide, for example. In some embodiments, the native oxide layer 103 has a sixth thickness $t_6$ that is in a range of between approximately 0.1 nanometers and approximately 1 nanometer.

Figure 4:
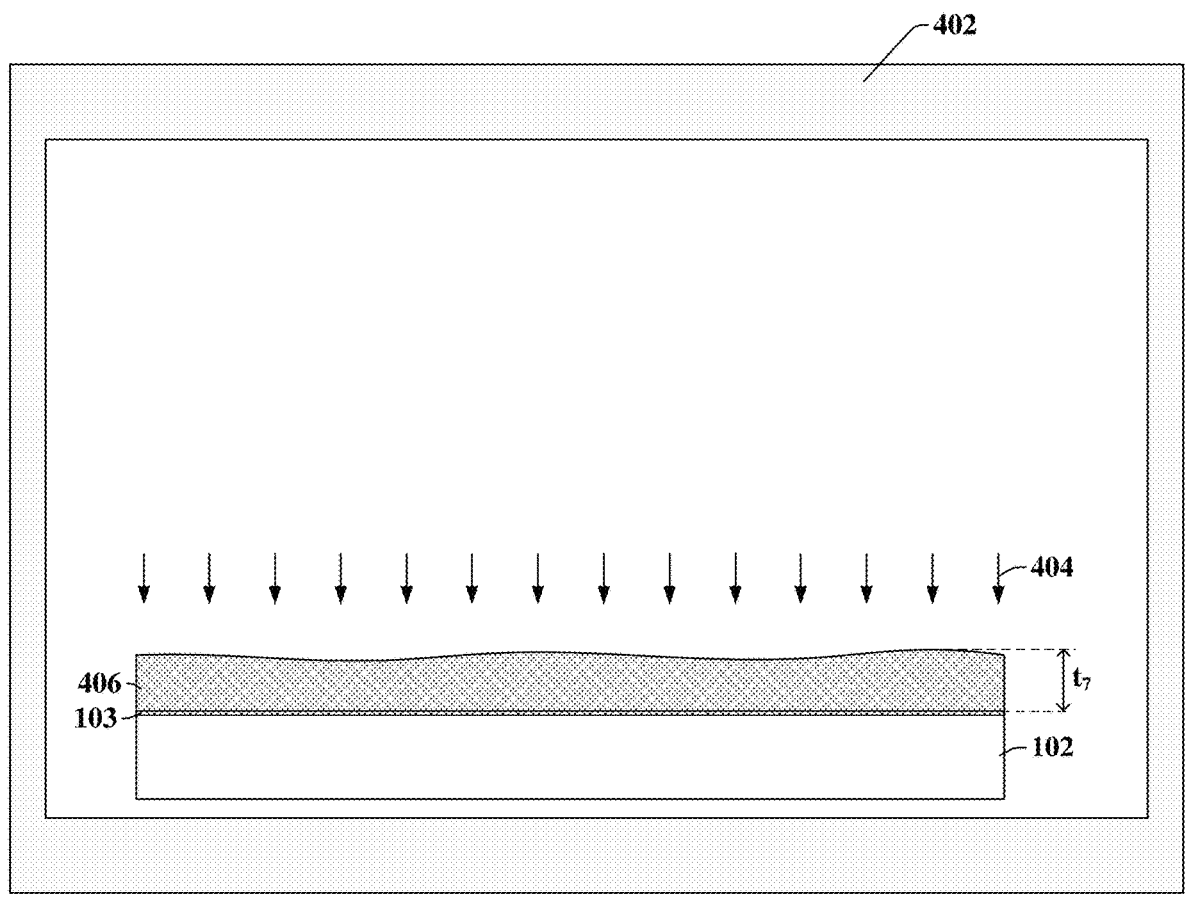

As shown in cross-sectional view 400 of FIG. 4, the semiconductor substrate 102 may be loaded into an epi chamber 402. In some embodiments, the epi chamber may be a low pressure chemical vapor deposition (LPCVD) chamber. A polysilicon deposition process 404 may be conducted in the epi chamber 402 at a first temperature using a first precursor for a first time to deposit a first polysilicon layer 406 over the native oxide layer 103. In some embodiments, the native oxide layer 103 allows the first polysilicon layer 406 to comprise polysilicon, instead of growing the semiconductor substrate 102 further through an epitaxial process. For example, supposing the semiconductor substrate 102 is monocrystalline silicon, a monocrystalline silicon layer may grow in place of the first polysilicon layer 406 if the native oxide layer 103 were omitted. Thus, with the presence of the native oxide layer 103, the first polysilicon layer 406 is distinct from the semiconductor substrate 102. In some embodiments, the first polysilicon layer 406 is grown to a seventh thickness $t_7$ that may be in a range of, for example, between approximately 20 nanometers and approximately 60 nanometers. In some embodiments, the first polysilicon layer 406 has a top surface that appears to be wavy or non-planar, whereas in other embodiments, the first polysilicon layer 406 may have a top surface that is substantially planar (e.g., FIG. 1A).

For example, in some embodiments, such as in a variable temperature deposition method, the polysilicon deposition process 404 may be conducted in the epi chamber 402 at the first temperature of between approximately 650 degrees Celsius and approximately 875 degrees Celsius, using the first precursor comprising dichlorosilane (DCS), and for the first time of approximately 20 seconds, such that the seventh thickness $t_7$ is in a range of between approximately 55 nanometers and approximately 65 nanometers. For example, in some embodiments, the first temperature may be about equal to 850 degrees Celsius, and the seventh thickness $t_7$ may be about equal to 60 nanometers. In some embodiments, the variable temperature deposition may be conducted using a pressure of approximately 80 torr. In other embodiments, the first time may be increased to increase the seventh thickness $t_7$ of the first polysilicon layer 406. Under the aforementioned conditions of the variable temperature deposition method, the first polysilicon layer 406 may have a grain structure similar to the schematic 100B in FIG. 1B, having the first average grain size $d_1$ that is in a range of between approximately 100 nanometers and approximately 200 nanometers. In some embodiments, the first average grain size $d_1$ of the first polysilicon layer 406 is measured from a cross-section that is into and out of the page with respect to the cross-sectional view 400 of FIG. 4.

For example, in other embodiments, such as in a constant temperature deposition method, the polysilicon deposition process 404 may be conducted in the epi chamber 402 at the first temperature of between approximately 650 degrees Celsius and approximately 750 degrees Celsius, using the first precursor comprising silane, and for the first time of approximately 40 seconds, such that the seventh thickness $t_7$ is in a range of between approximately 15 nanometers and approximately 25 nanometers. For example, in some embodiments, the first temperature may be about equal to 690 degrees Celsius, and the seventh thickness $t_7$ may be about equal to 20 nanometers. In some embodiments, the constant temperature deposition method is conducted using a pressure of approximately 30 torr. Although the first time of the constant temperature deposition method is greater than the first time of the variable temperature deposition method, the seventh thickness $t_7$ of the constant temperature deposition method may be less than the seventh thickness $t_7$ of the variable temperature deposition method because the first temperature of the constant temperature deposition method is less than the first temperature of the variable temperature deposition method. Nevertheless, the first time, first temperature, and/or first precursor conditions may be adjusted to tune the seventh thickness $t_7$ of the first polysilicon layer 406 to a desired value.

Under the aforementioned conditions of the constant temperature deposition method, the first polysilicon layer 406 may have a grain structure similar to the schematic 100D of FIG. 1D, having the third average grain size $d_3$ that is in a range of between approximately 15 nanometers and approximately 22 nanometers. The third average grain size $d_3$ may be less than the first average grain size $d_1$ because of the constant temperature deposition method utilizes a first temperature that is less than the first temperature of the variable temperature deposition method. Thus, in some embodiments, a lower first temperature reduces grain growth, and thus, provides more grain boundaries to trap free charge carriers.

Figure 5:
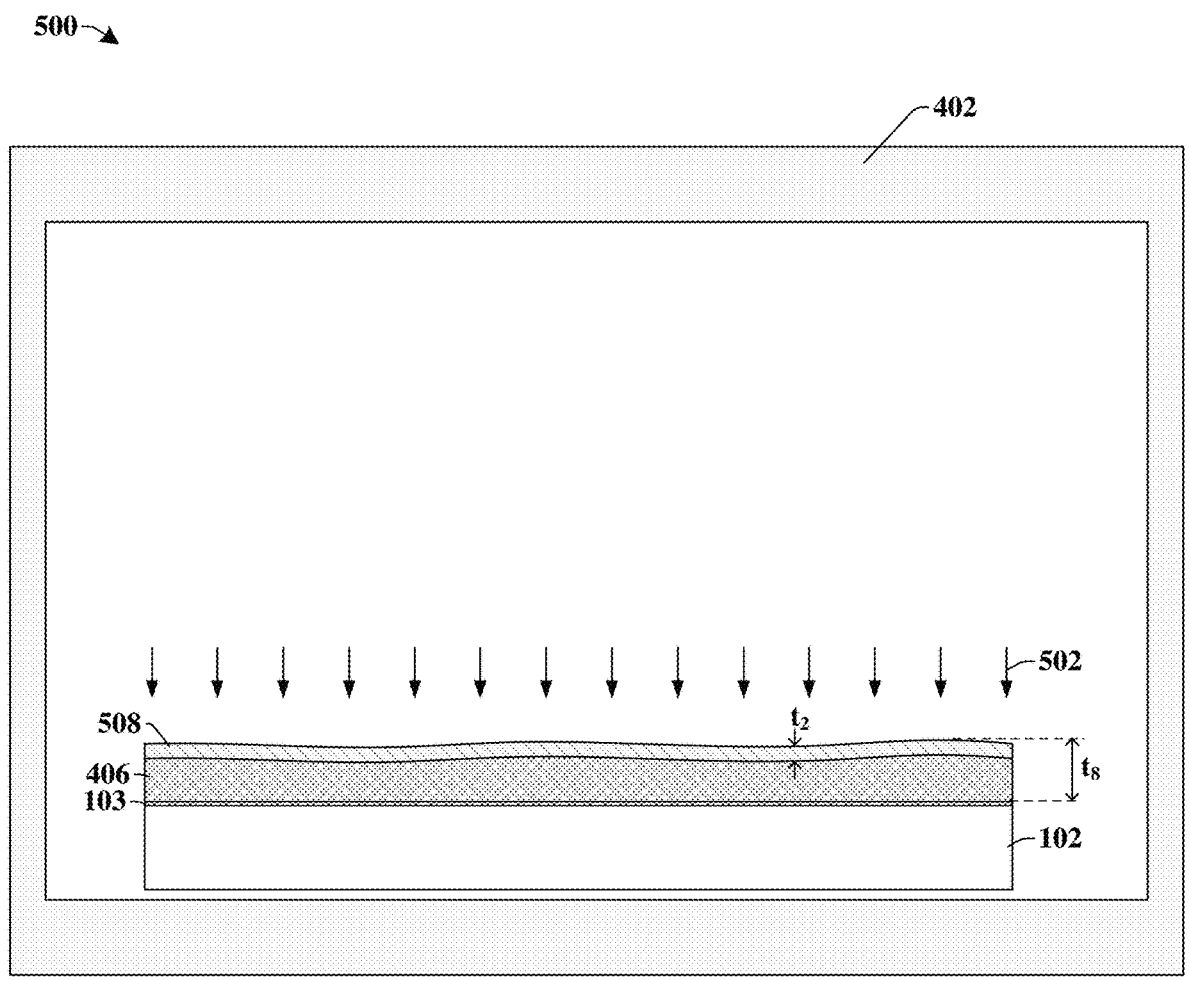

As shown in cross-sectional view 500 of FIG. 5, an oxygen-doping process 502 is conducted in the epi chamber 402 at a second temperature using a second precursor for a second time to form a first oxygen-doped polysilicon layer 508 over the first polysilicon layer 406. In some embodiments, the oxygen-doping process 502 dopes a top surface of the first polysilicon layer 406 to a second thickness $t_2$. In some embodiments, the second thickness $t_2$ may be in a range of between approximately 1 nanometer and approximately 2 nanometers. Thus, after the first oxygen-doped polysilicon layer 508 is formed, together the first polysilicon layer 406 and the first oxygen-doped polysilicon layer 508 have an eighth thickness $t_8$ that is equal to or about equal to the seventh thickness $t_7$ of FIG. 4.

In some embodiments, the oxygen-doping process 502 is conducted in the epi chamber 402 using a mixture comprising helium and oxygen gas for the second precursor. To prevent a reaction in the epi chamber 402, which utilizes hydrogen gas for purging, the concentration of oxygen in the second precursor is low. For example, in some embodiments, the second precursor comprises between approximately 0.1 atomic percent oxygen and approximately 1 atomic percent oxygen mixed with helium gas. In some embodiments, the mixture of helium and oxygen gas is premixed, and may enter the epi chamber 402 at a flow rate of 500 standard cubic centimeters per minute. In some embodiments, the hydrogen gas flows into the epi chamber 402 at a flow rate of 50 standard liters per minute. Therefore, the concentration of oxygen in the epi chamber 402 may be 10 parts per million compared to the concentration of hydrogen in the epi chamber 402. Further, in some embodiments, the second time may be approximately 20 seconds, and the second temperature may be in a range of between approximately 650 degrees Celsius and approximately 700 degrees Celsius. After the oxygen-doping process 502, a purging step may take place to clean the epi chamber 402. The purging step may comprise hydrogen gas at a flow rate of 50 standard liters per minute.

For example, in some embodiments, such as in the variable temperature deposition method, the oxygen-doping process 502 may be conducted in the epi chamber 402 at the second temperature in a range of between approximately 550 degrees Celsius and approximately 750 degrees Celsius. For example, in some embodiments, the second temperature may be about equal to approximately 650 degrees Celsius. In some embodiments of the variable temperature deposition method, the first polysilicon layer 406 may have a grain structure similar to the schematic 100B in FIG. 1B, and the first oxygen-doped polysilicon layer 508 may have a grain structure similar to the schematic 100C in FIG. 1C, having the second average grain size $d_2$ that is in a range of between approximately 20 nanometers and approximately 40 nanometers. In some embodiments, the second average grain size $d_2$ of the first oxygen-doped polysilicon layer 508 is measured from a cross-section that is into and out of the page with respect to in cross-sectional view 500 of FIG. 5. Further, in the variable temperature deposition method, the second temperature of the oxygen-doping process 502 is less than the first temperature of the polysilicon deposition process 404 of FIG. 4. In some embodiments, the first time and the second time of the variable temperature deposition method may be equal.

For example, in other embodiments, such as the constant temperature deposition method, the oxygen-doping process 502 may be conducted in the epi chamber 402 at the second temperature of between approximately 550 degrees Celsius and approximately 750 degrees Celsius. For example, in some embodiments, the second temperature may be about equal to approximately 690 degrees Celsius. In some embodiments of the constant temperature deposition method, the first polysilicon layer 406 may have a grain structure similar to the schematic 100D in FIG. 1D, and the first oxygen-doped polysilicon layer 508 may have a grain structure similar to the schematic 100E in FIG. 1E, having the fourth average grain size $d_4$ that is in a range of between approximately 1 nanometer and approximately 10 nanometers. Further, in the constant temperature deposition method, the second temperature of the oxygen-doping process 502 is about equal to the first temperature of the polysilicon deposition process 404 of FIG. 4. In some embodiments of the constant temperature method, the first time is greater than the second time.

In some embodiments of either the constant or variable deposition temperature methods, the concentration of oxygen in the first oxygen-doped polysilicon layer 508 may be in a range of between 10 percent and approximately 20 percent due to the low concentration oxygen in the second precursor and/or the second time. Thus, the first oxygen-doped polysilicon layer 508 is polysilicon with a small amount of oxygen, and is not silicon dioxide. The composition of the first oxygen-doped polysilicon layer 508 may create an atomic structure that has dangling bonds, which may collect free charge carriers. Thus, the first oxygen-doped polysilicon layer 508 has a smaller average grain size than the first polysilicon layer 406 and also has dangling bonds, providing two mechanisms to trap free charge carriers, thereby maintaining the high resistivity of the semiconductor substrate 102. Although the first oxygen-doped polysilicon layer 508 provides more mechanisms as a trap-rich layer for free charge carriers than the first polysilicon layer 406, the oxygen-doping process 502 is time consuming. Thus, in some embodiments, throughput constraints may limit the second thickness $t_2$ of the first oxygen-doped polysilicon layer 508.

Figure 6:
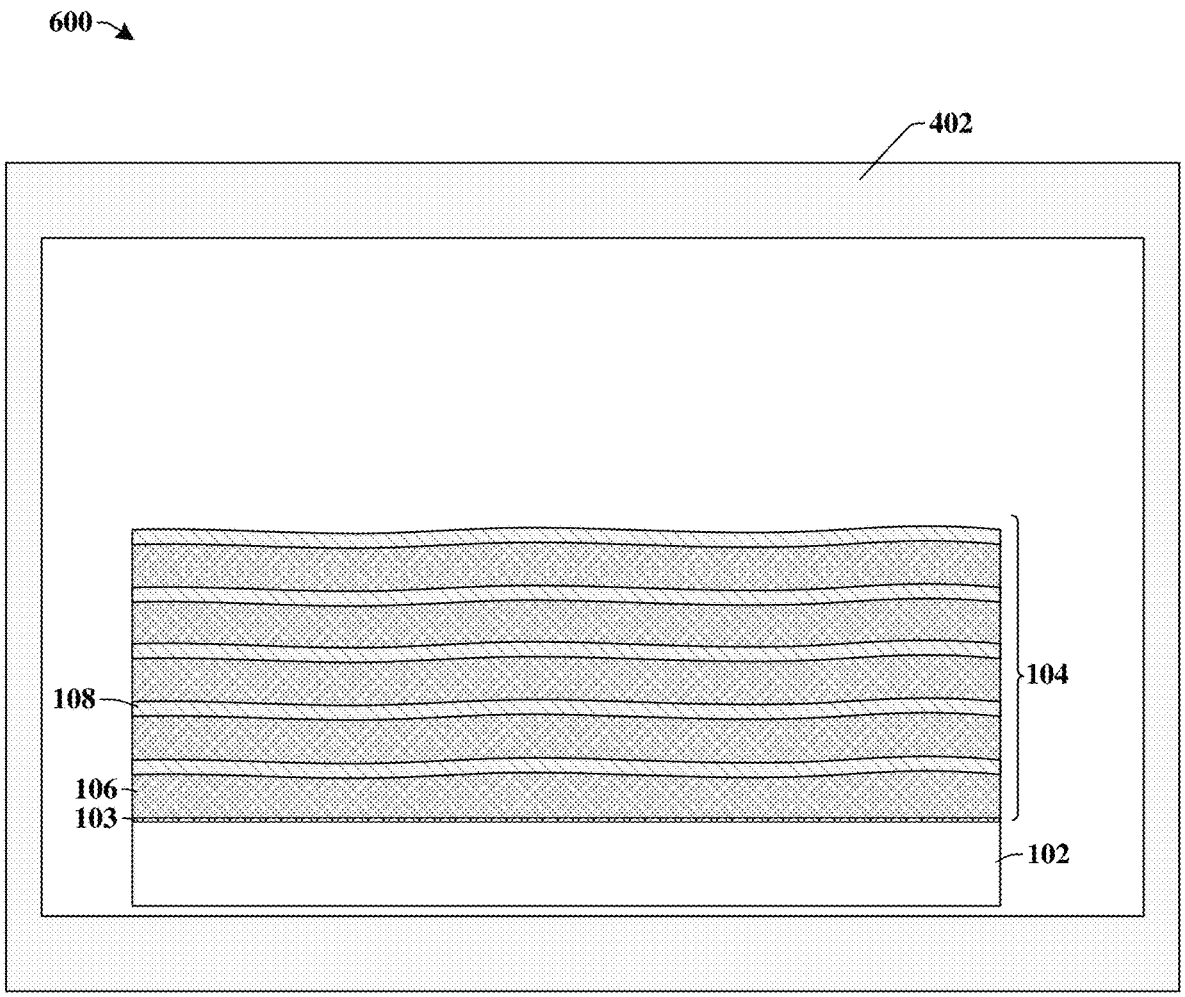

As shown in cross-sectional view 600 of FIG. 6, the polysilicon deposition process 404 of FIG. 4, the oxygen-doping process 502 of FIG. 5, and the purging step may be repeated multiple times to form a multi-layer polysilicon structure 104 comprising many oxygen-doped polysilicon layers 108 alternatingly stacked with many polysilicon layers 106. The number of the oxygen-doped polysilicon layers 108 and the number of the polysilicon layers 106 in the multi-layer polysilicon structure 104 may depend on multiple factors such as desired total size (e.g., thickness) of the high resistivity SOI substrate, the number of oxygen-doped polysilicon layers 108 to be effective in trapping free charge carriers, and/or throughput, for example. In some embodiments, the multi-layer polysilicon structure 104 may comprise between 3 oxygen-doped polysilicon layers 108 and 50 oxygen-doped polysilicon layers 108. Further, in some embodiments, the ratio of the total number of oxygen-doped polysilicon layers 108 to the total number of polysilicon layers 106 in the multi-layer polysilicon structure 104 is one-to-one.

Further, in some embodiments, the polysilicon deposition process 404 of FIG. 4, the oxygen-doping process 502 of FIG. 5, and the purging step to form the first polysilicon layer 406 of FIG. 4 and the first oxygen-doped polysilicon layer 508 of FIG. 5 may be classified as a cycle. Thus, for a multi-layer polysilicon structure 104 comprising 5 oxygen-doped polysilicon layers 108, as in FIG. 6, 5 cycles are performed. All of the cycles may be performed in-situ (e.g., in the same chamber) in the epi chamber 402. In some embodiments of the variable temperature deposition method, each cycle may take up to approximately 4 minutes, whereas in some embodiments of the constant temperature deposition method, each cycle may take up to approximately 1.3 minutes. The variable temperature deposition process may have a longer cycle time because of the temperature ramping required between each step in the cycle. Thus, the constant temperature deposition process may have a higher throughput than the variable temperature deposition process to form a high resistivity SOI substrate.

In addition to trapping free charge carriers, the oxygen-doped polysilicon layers 108 also mitigates grain growth in the polysilicon layers 106 during high temperature processes, as grains are often prone to grow under high temperatures. Thus, by mitigating grain growth, the oxygen-doped polysilicon layers 108 protect the grains in the polysilicon layers 106 and prevent a decrease in the number of grain boundaries present to trap free charge carriers. In some embodiments, the presence of the oxygen-doped polysilicon layer 108 may increase the resistivity of the semiconductor substrate 102 from approximately 30 ohm-centimeters to approximately 120 ohms-centimeters, for example.

Figure 7:
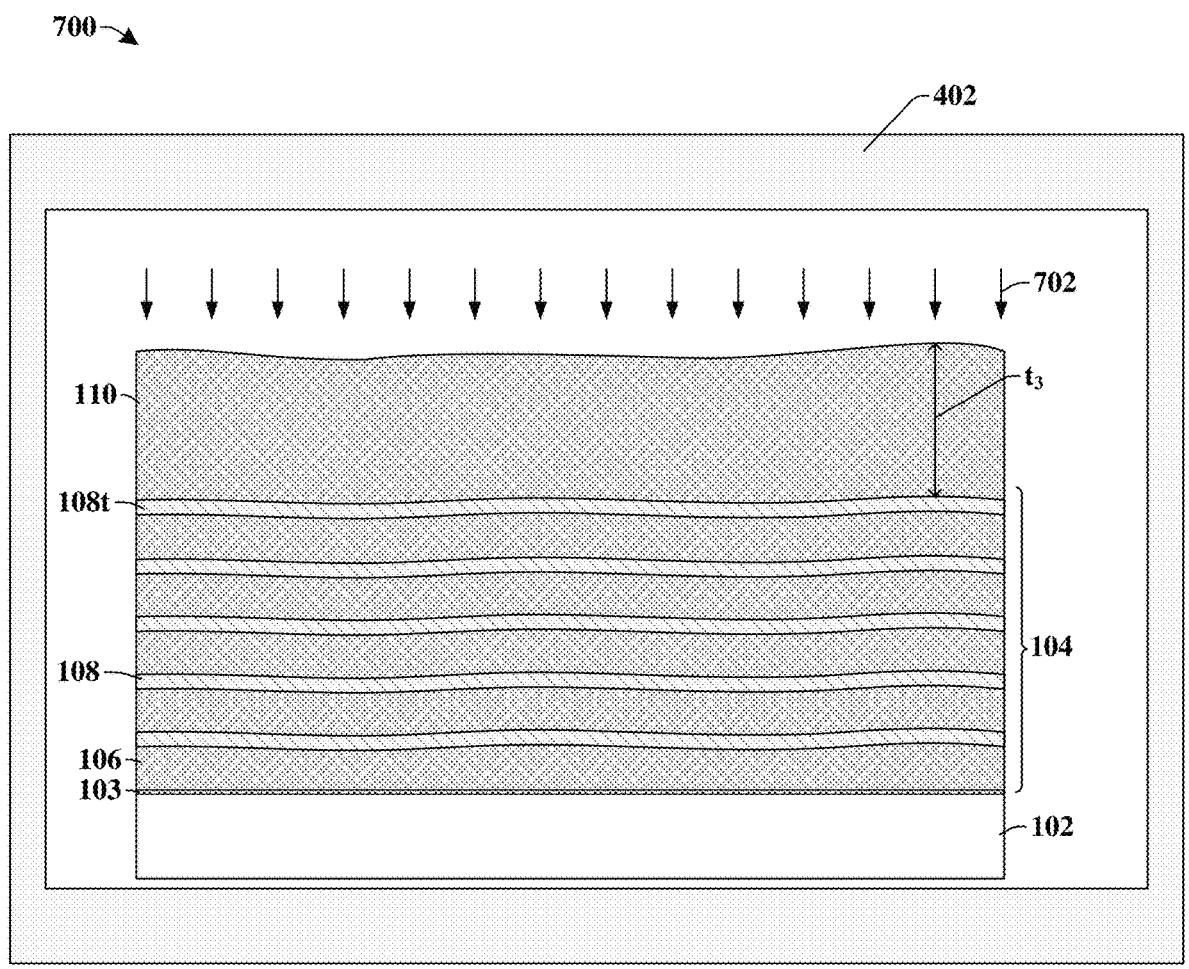

As shown in cross-sectional view 700 of FIG. 7, a capping deposition process 702 is performed in the epi chamber 402 to form a cap polysilicon layer 110 over a topmost layer 108t of the oxygen-doped polysilicon layers 108. Thus, the cap polysilicon layer 110 may be performed in-situ (e.g., in the same chamber) with the multi-layer polysilicon structure 104. In some embodiments, the capping deposition process 702 uses the first precursor at a third temperature for a third time to form the cap polysilicon layer 110 at a third thickness $t_3$. For example, in the variable temperature deposition process, the first precursor may comprise DCS, whereas in the constant temperature deposition process, the first precursor may comprise silane. In some embodiments, the cap polysilicon layer 110 is thicker than any of the underlying polysilicon layers 106. Thus, the capping deposition process 702 may be conducted over a third time that is greater than the first time of the polysilicon deposition process 404 of FIG. 4. In some embodiments, the third time of the capping deposition process 702 may depend on the third thickness $t_3$ and be in a range of between, for example, approximately 20 minutes and approximately 25 minutes. To increase the third thickness $t_3$, the third time may be increased. In some embodiments, the third temperature may be greater than the first temperature, whereas in other embodiments, the third temperature may be about equal to the first temperature.

For example, in some embodiments of the variable temperature deposition process, the third temperature may be equal to approximately 850 degrees Celsius, and thus, approximately equal to the first temperature. Thus, the cap polysilicon layer 110 and the polysilicon layers 106 may have a same average grain size. Further, in some embodiments of the constant temperature deposition process, the third temperature may be equal to approximately 720 degrees Celsius, and thus, greater than the first and second temperatures. Thus, in such embodiments, the cap polysilicon layer 110 may have an average grain size that is greater than the polysilicon layers 106, and the cap polysilicon layer 110 may have a higher growth rate (e.g., thickness per time) than the polysilicon layers 106. To decrease the third time in order to increase throughput, in some embodiments, the third temperature is increased. Nevertheless, the cap polysilicon layer 110 may trap free charge carriers, and then the multi-layer polysilicon structure 104 may further trap free charge carriers to protect the semiconductor substrate 102.

Figure 8:
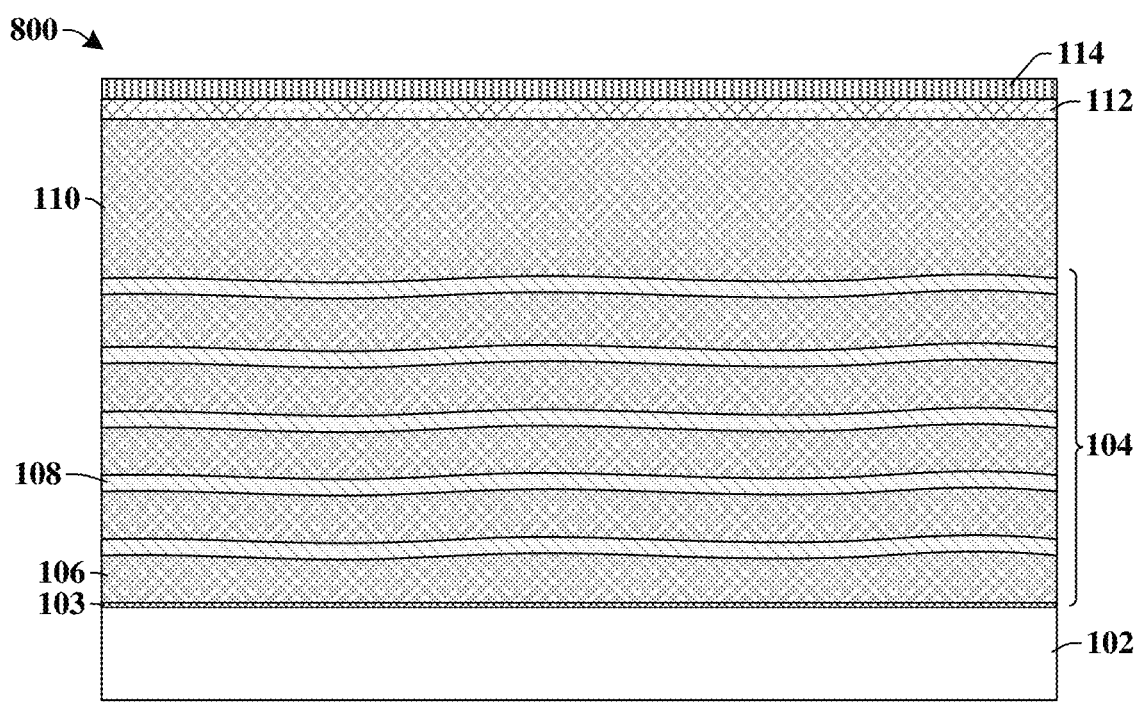

As shown in cross-sectional view 800 of FIG. 8, an insulator layer 112 may be formed over the cap polysilicon layer 110, and a device layer 114 may be formed over the insulator layer 112. In some embodiments, the insulator layer 112 may comprise a high-k dielectric, an oxide (e.g., silicon dioxide), or some other insulator material. The insulator layer 112 may be formed in a furnace to a thickness in a range of between approximately 1 nanometer and approximately 2 micrometers. The device layer 114 may comprise an active semiconductor layer comprising a semiconductor material and/or RF devices (see, FIG. 2). Further, in some embodiments, the cap polysilicon layer 110 may undergo a planarization process (e.g., chemical mechanical planarization) before deposition of the insulator layer 112 to ensure that the device layer 114 is substantially planar.

Figure 9:
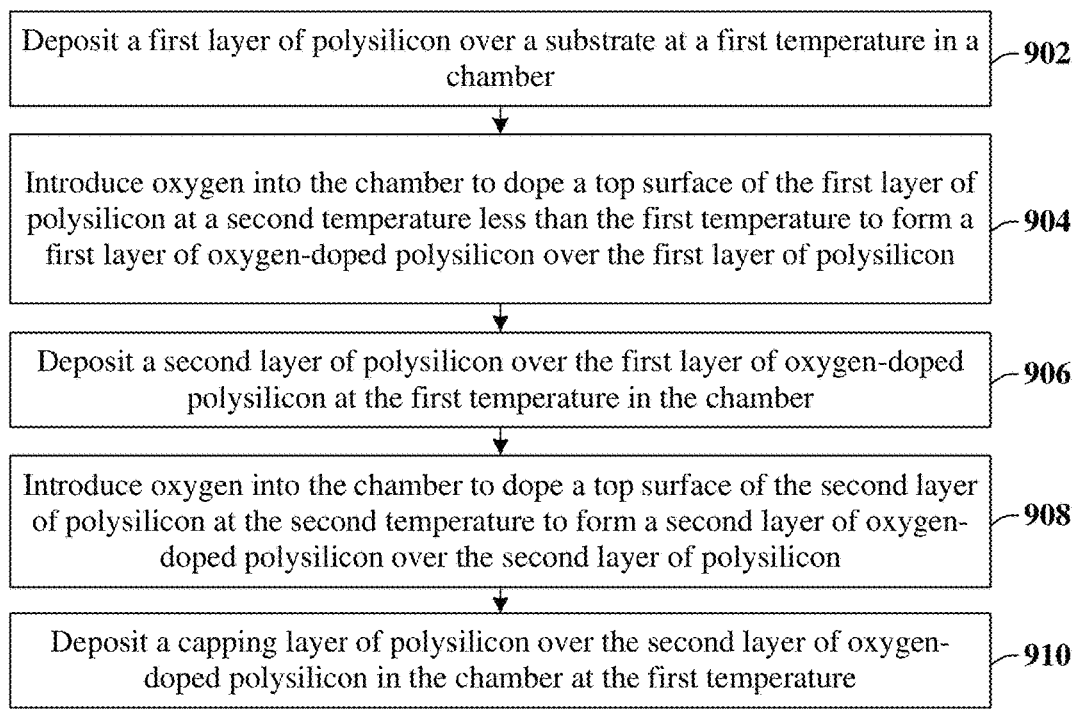
FIGS. 9-11 illustrate flow diagrams of some embodiments of the methods describing FIGS. 3-8.
Figure 10:
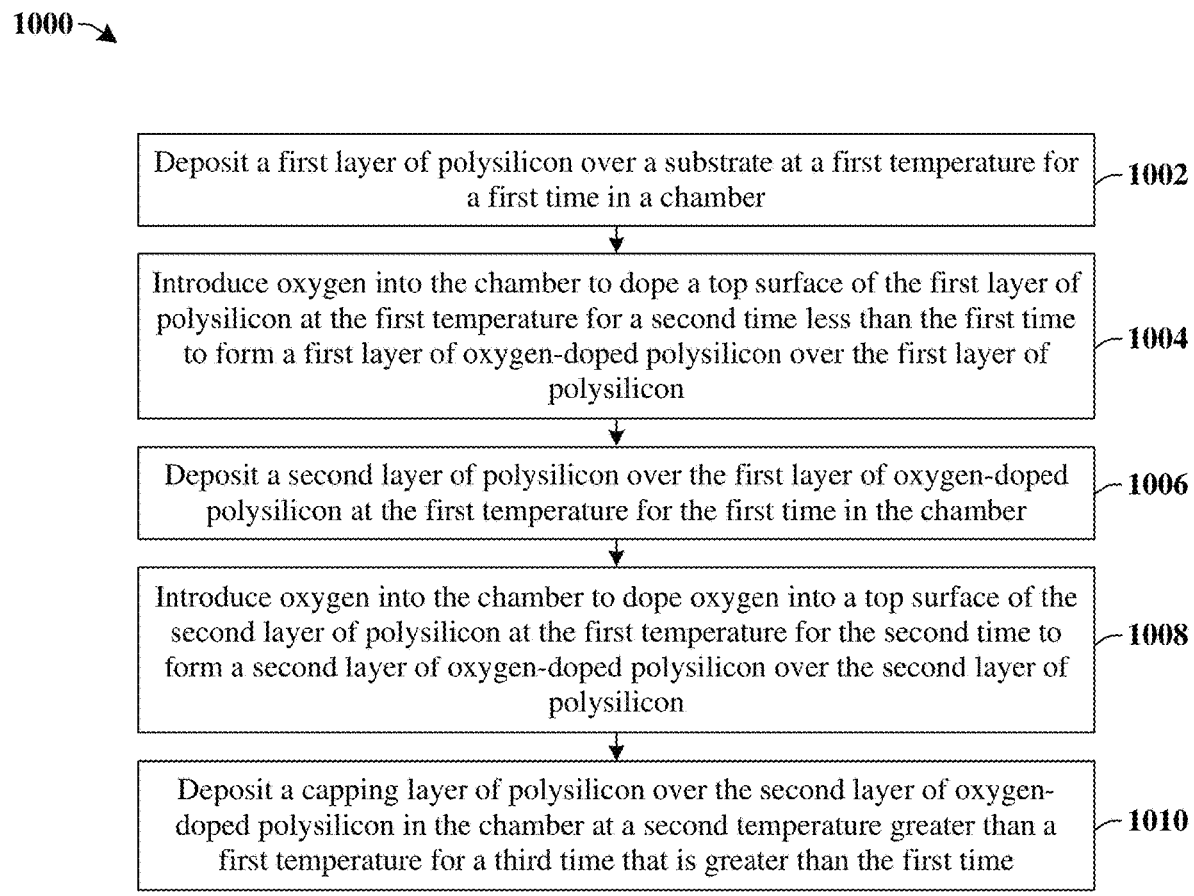
Figure 11:
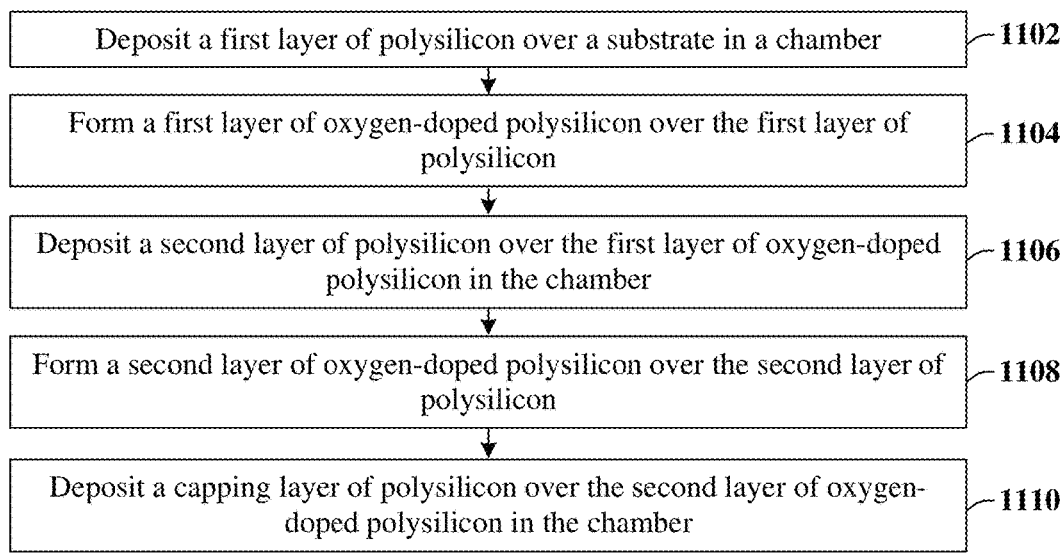

FIGS. 9, 10, and 11 illustrate flow diagrams of some embodiments of methods 900, 1000, and 1100 of forming a high resistivity SOI substrate.

While methods 900, 1000, and 1100 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 9 illustrates a flow diagram of some embodiments of the method 900 for forming a high resistivity SOI substrate having oxygen-doped polysilicon layers using a variable temperature deposition process.

At act 902, a first layer of polysilicon is deposited over a substrate at a first temperature in a chamber. FIG. 4 illustrates a cross-sectional view 400 of some embodiments corresponding to act 902. For example, in some embodiments, a first precursor comprising DCS may be used in an epi chamber at the first temperature about equal to 850 degrees Celsius for approximately 20 seconds to form the first layer of polysilicon.

At act 904, oxygen is introduced into the chamber to dope a top surface of the first layer of polysilicon at a second temperature less than the first temperature to form a first layer of oxygen-doped polysilicon over the first layer of polysilicon. FIG. 5 illustrates a cross-sectional view 500 of some embodiments corresponding to act 904. For example, in some embodiments, a second precursor comprising a mixture of oxygen and helium gas may be used in an epi chamber at the second temperature about equal to 650 degrees Celsius for approximately 20 seconds to form the first layer of oxygen-doped polysilicon.

At act 906, a second layer of polysilicon is deposited over the first layer of oxygen-doped polysilicon at the first temperature in the chamber. For example, in some embodiments, a first precursor comprising DCS may be used in an epi chamber at the first temperature about equal to 850 degrees Celsius for approximately 20 seconds to form the second layer of polysilicon.

At act 908, oxygen is introduced into the chamber to dope a top surface of the second layer of polysilicon at the second temperature to form a second layer of oxygen-doped polysilicon over the second layer of polysilicon. FIG. 6 illustrates a cross-sectional view 600 of some embodiments corresponding to acts 906 and 908. For example, in some embodiments, a second precursor comprising a mixture of oxygen and helium gas may be used in an epi chamber at the second temperature about equal to 650 degrees Celsius for approximately 20 seconds to form the second layer of oxygen-doped polysilicon.

At act 910, a capping layer of polysilicon is deposited over the second layer of oxygen-doped polysilicon in the chamber at the first temperature. FIG. 7 illustrates a cross-sectional view 700 of some embodiments corresponding to act 910. For example, in some embodiments, the first precursor comprising DCS may be used in an epi chamber at the first temperature about equal to 850 degrees Celsius for approximately 20 minutes to form the capping layer of polysilicon.

FIG. 10 illustrates a flow diagram of some embodiments of the method 1000 for forming a high resistivity SOI substrate having oxygen-doped polysilicon layers using a constant temperature deposition process.

At act 1002, a first layer of polysilicon is deposited over a substrate at a first temperature for a first time in a chamber. FIG. 4 illustrates a cross-sectional view 400 of some embodiments corresponding to act 1002. For example, in some embodiments, a first precursor comprising silane may be used in an epi chamber at the first temperature about equal to 690 degrees Celsius for a first time about equal to 40 seconds to form the first layer of polysilicon.

At act 1004, oxygen is introduced into the chamber to dope a top surface of the first layer of polysilicon at the first temperature less for a second time less than the first time to form a first layer of oxygen-doped polysilicon over the first layer of polysilicon. FIG. 5 illustrates a cross-sectional view 500 of some embodiments corresponding to act 1004. For example, in some embodiments, a second precursor comprising a mixture of oxygen and helium gas may be used in an epi chamber at the first temperature about equal to 690 degrees Celsius for a second time about equal to 20 seconds to form the first layer of oxygen-doped polysilicon.

At act 1006, a second layer of polysilicon is deposited over the first layer of oxygen-doped polysilicon at the first temperature for the first time in the chamber. For example, in some embodiments, a first precursor comprising silane may be used in an epi chamber at the first temperature about equal to 690 degrees Celsius for the first time about equal to 40 seconds to form the second layer of polysilicon.

At act 1008, oxygen is introduced into the chamber to dope a top surface of the second layer of polysilicon at the first temperature for the second time to form a second layer of oxygen-doped polysilicon over the second layer of polysilicon. FIG. 6 illustrates a cross-sectional view 600 of some embodiments corresponding to acts 1006 and 1008. For example, in some embodiments, a second precursor comprising a mixture of oxygen and helium gas may be used in an epi chamber at the first temperature about equal to 690 degrees Celsius for the second time about equal to 20 seconds to form the second layer of oxygen-doped polysilicon.

At act 1010, a capping layer of polysilicon is deposited over the second layer of oxygen-doped polysilicon in the chamber at a second temperature greater than the first temperature for a third time greater than the first time. FIG. 7 illustrates a cross-sectional view 700 of some embodiments corresponding to act 1010. For example, in some embodiments, the first precursor comprising silane may be used in an epi chamber at a second temperature about equal to 720 degrees Celsius for a third time about equal to 25 minutes to form the capping layer of polysilicon.

FIG. 11 illustrates a flow diagram of some other embodiments of the method 1100 for forming a high resistivity SOI substrate having oxygen-doped polysilicon layers.

At act 1102, a first layer of polysilicon is deposited over a substrate in a chamber. FIG. 4 illustrates a cross-sectional view 400 of some embodiments corresponding to act 1102.

At act 1104, a first layer of oxygen-doped polysilicon is formed over the first layer of polysilicon. FIG. 5 illustrates a cross-sectional view 500 of some embodiments corresponding to act 1104.

At act 1106, a second layer of polysilicon is deposited over the first layer of oxygen-doped polysilicon in the chamber.

At act 1108, a second layer of oxygen-doped polysilicon is formed over the second layer of polysilicon. FIG. 6 illustrates cross-sectional view 600 of some embodiments corresponding to acts 1106 and 1108.

At act 1110, a capping layer of polysilicon is deposited over the second layer of oxygen-doped polysilicon in the chamber. FIG. 7 illustrates a cross-sectional view 700 of some embodiments corresponding to act 1110.

Therefore, the present disclosure relates to a high-resistivity SOI substrate comprising layers of oxygen-doped polysilicon between layers of polysilicon to prevent free charge carriers from concentrating in areas of a semiconductor substrate, thereby maintaining the reliability of RF devices arranged on the high-resistivity SOI substrate.

Accordingly, in some embodiments, the present disclosure relates to a high-resistivity silicon-on-insulator (SOI) substrate, comprising: a semiconductor substrate; a first polysilicon layer arranged over the semiconductor substrate; a second polysilicon layer arranged over the first polysilicon layer; a third polysilicon layer arranged over the second polysilicon layer; an insulator layer arranged over the third polysilicon layer; and an active semiconductor layer arranged over the insulator layer, wherein the second polysilicon layer has an elevated concentration of oxygen compared to the first and third polysilicon layers.

In other embodiments, the present disclosure relates to a high-resistivity silicon-on-insulator (SOI) substrate, comprising: a semiconductor substrate; an insulator layer over the semiconductor substrate; a trap-rich polysilicon structure arranged between the insulator layer and the semiconductor substrate, the trap-rich polysilicon structure comprising: a lower polysilicon layer having a first thickness and arranged over the semiconductor substrate; a lower oxygen-doped polysilicon layer having a second thickness and arranged over the lower polysilicon layer; an upper polysilicon layer having a third thickness and arranged over the lower oxygen-doped polysilicon layer; an upper oxygen-doped polysilicon layer having a fourth thickness and arranged over the upper polysilicon layer; and a cap polysilicon layer having a fifth thickness and arranged over the upper oxygen-doped polysilicon layer, wherein the first thickness and the third thickness are each greater than the second thickness and the fourth thickness, and wherein the third thickness is greater than the first thickness and the third thickness.

In yet other embodiments, the present disclosure relates to a method of forming a high-resistivity silicon-on-insulator (SOI) substrate, the method comprising: depositing a first layer of polysilicon over a semiconductor substrate in a chamber; forming a first layer of oxygen-doped polysilicon in the chamber; depositing a second layer of polysilicon over the first layer of oxygen-doped polysilicon in the chamber; forming a second layer of oxygen-doped polysilicon in the chamber; and depositing a capping layer of polysilicon over the second layer of oxygen-doped polysilicon in the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first layer of polysilicon over a substrate at a first temperature in a chamber;
   introducing oxygen into the chamber to dope a top surface of the first layer of polysilicon at a second temperature less than the first temperature to form a first layer of oxygen-doped polysilicon over the first layer of polysilicon;
   depositing a second layer of polysilicon over the first layer of oxygen-doped polysilicon at the first temperature in the chamber;
   introducing oxygen into the chamber to dope a top surface of the second layer of polysilicon at the second temperature to form a second layer of oxygen-doped polysilicon over the second layer of polysilicon; and
   depositing a capping layer of polysilicon over the second layer of oxygen-doped polysilicon in the chamber at the first temperature;
   wherein the first layer of oxygen-doped polysilicon comprises polycrystalline grains and a concentration of oxygen between 10%-20%, wherein the introducing of oxygen into the chamber to dope the top surface of the first layer of polysilicon comprises flowing a premixed gas of helium and oxygen into the chamber at a flow rate of 500 standard cubic centimeters per minute (SCCM), wherein the premixed gas has 0.1-1 atomic percent oxygen, and wherein the first and second layers of polysilicon, the first and second layers of oxygen-doped polysilicon, and the capping layer partially form a semiconductor-on-insulator (SOI) substrate.

2. The method of claim 1, wherein the depositing of the first layer of polysilicon and the second layer of polysilicon are each conducted over a first time period, and wherein the depositing of the capping layer is conducted over a second time period that is greater than the first time period.

3. The method of claim 1, wherein the chamber is an epi chamber, and wherein the method further comprises cleaning the chamber with hydrogen gas after the second layer of oxygen-doped polysilicon is formed and before the deposition of the capping layer.

4. The method of claim 3, further comprising:
   forming a native oxide layer over the substrate before forming the first layer of polysilicon.

5. The method according to claim 1, wherein the second temperature is 550-750 degrees Celsius.

6. The method according to claim 4, wherein the first and second layers of polysilicon are deposited using a first precursor gas of dichlorosilane (DCS) for 20 seconds at the first temperature, which is 850 degrees Celsius, wherein the first and second layers of oxygen-doped polysilicon are deposited using the premixed gas for 20 seconds at the second temperature, which is 650 degrees Celsius, wherein the capping layer of polysilicon is deposited using another precursor gas of DCS for 20 minutes at the first temperature, and wherein a silicon dioxide layer overlies and directly contacts the capping layer and further partially forms the SOI substrate.

7. The method of claim 6, wherein an average grain size of polycrystalline grains in the first layer of polysilicon is substantially uniform from a bottom surface of the first layer of polysilicon to the top surface of the first layer of polysilicon.

8. The method of claim 1, wherein the introducing of oxygen into the chamber to dope the top surface of the first layer of polysilicon further comprises flowing hydrogen gas into the chamber at a flow rate of 50 standard liters per minute, and wherein the flowing of the premixed gas and the flowing of the hydrogen gas yields 10 parts per million (PPM) oxygen, relative to hydrogen, within the chamber.

9. A method comprising:
forming a first layer of polysilicon over a semiconductor substrate;
forming a first layer of oxygen-doped polysilicon over and completely covering the first layer of polysilicon;
forming a second layer of polysilicon over and completely covering the first layer of oxygen-doped polysilicon;
forming a second layer of oxygen-doped polysilicon over and completely covering the second layer of polysilicon;
forming a cap polysilicon layer over and completely covering the second layer of oxygen-doped polysilicon;
forming an insulator layer over the cap polysilicon layer; and
forming an active semiconductor layer over the insulator layer;
wherein the first and second layers of oxygen-doped polysilicon each have polycrystalline grains and a higher number of dangling bonds than each of the first layer of polysilicon, the second layer of polysilicon, and the cap polysilicon layer, and wherein the first layer of oxygen-doped polysilicon is poly-crystalline continuously from the first layer of polysilicon to the second layer of polysilicon, wherein the forming of the first layer of oxygen-doped polysilicon comprises flowing a premixed gas of helium and oxygen into an epi chamber at a flow rate of 500 standard cubic centimeters per minute (SCCM), wherein the premixed gas has 0.1-1 atomic percent oxygen, and wherein the first layer of oxygen-doped polysilicon comprises a concentration of oxygen between 10%-20%.

10. The method of claim 9, wherein the first and second layers of oxygen-doped polysilicon each have a higher concentration of oxygen and a smaller grain size than each of the first layer of polysilicon, the second layer of polysilicon, and the cap polysilicon layer.

11. The method of claim 9, wherein the first layer of oxygen-doped polysilicon and the second layer of oxygen-doped polysilicon are formed at a lower temperature than the formation of the cap polysilicon layer, the first layer of polysilicon, and the second layer of polysilicon.

12. The method of claim 9, wherein the first layer of oxygen-doped polysilicon is completely crystalline, wherein a top surface of the first layer of polysilicon is in direct contact with a bottom surface of the first layer of oxygen-doped polysilicon, and wherein a top surface of the first layer of oxygen-doped polysilicon is in direct contact with a bottom surface of the second layer of polysilicon.

13. The method of claim 9, wherein the forming of the first layer of oxygen-doped polysilicon comprises flowing hydrogen gas into the epi chamber at a flow rate of 50 standard liters per minute, wherein the flowing of the premixed gas and the flowing of the hydrogen gas yields 10 parts per million (PPM) oxygen, relative to hydrogen, within the epi chamber.

14. The method of claim 13, further comprising:
forming a native oxide layer overlying and directly contacting the semiconductor substrate, wherein the native oxide layer is formed with a bottom surface and a top surface that both have planar profiles, wherein the first layer of polysilicon is formed overlying and directly contacting the native oxide layer, wherein the first layer of polysilicon is formed with a bottom surface that has a planar profile and a top surface that has a wavy profile, and wherein the cap polysilicon layer is formed with a bottom surface that has a wavy profile.

15. A method of forming a high-resistivity silicon-on-insulator (SOI) substrate, the method comprising:
depositing a first layer of polysilicon over a semiconductor substrate in a chamber;
forming a first layer of oxygen-doped polysilicon in the chamber;
depositing a second layer of polysilicon over the first layer of oxygen-doped polysilicon in the chamber;
forming a second layer of oxygen-doped polysilicon in the chamber; and
depositing a capping layer of polysilicon over the second layer of oxygen-doped polysilicon in the chamber,
wherein the first and second layers of oxygen-doped polysilicon comprise polycrystalline grains and have higher concentrations of oxygen compared to the first and second layers of polysilicon and compared to the capping layer of polysilicon, wherein the first layer of oxygen-doped polysilicon is formed by diffusing oxygen into a top surface of the first layer of polysilicon, wherein the diffusing comprises introducing a premixed gas of oxygen and helium into the chamber at a flow rate of 500 standard cubic centimeters per minute (SCCM), wherein the premixed gas is less than 1 atomic percent oxygen, wherein the first and second layers of oxygen-doped polysilicon comprise a concentration of oxygen between 10%-20%, and wherein the first layer of oxygen-doped polysilicon is poly-crystalline continuously from the first layer of polysilicon to the second layer of polysilicon.

16. The method of claim 15, wherein the first layer of polysilicon, the first layer of oxygen-doped polysilicon, the second layer of polysilicon, and the second layer of oxygen-doped polysilicon are respectively formed at a first temperature for a first time, a second temperature for a second time, a third temperature for a third time, and a fourth temperature for a fourth time, wherein the first and third temperatures are each greater than the second and fourth temperatures, wherein the third temperature is about equal to the first temperature, and wherein the first, second, third, and fourth times are about equal.

17. The method of claim 15, wherein the first layer of polysilicon, the first layer of oxygen-doped polysilicon, the second layer of polysilicon, the second layer of oxygen-doped polysilicon, and the capping layer of polysilicon are respectively formed at a first temperature for a first time, a second temperature for a second time, a third temperature for a third time, a fourth temperature for a fourth time, and a fifth temperature for a fifth time, wherein the first, second, third, and fourth temperatures are about equal, wherein the fifth temperature is greater than the first temperature, wherein the first time is greater than the second time, wherein the third time is greater than the fourth time, and wherein the fifth time is greater than the first time and the third time.

18. The method of claim 15, further comprising:
depositing an insulator layer over the capping layer of polysilicon; and
depositing a semiconductor layer over the insulator layer.

19. The method according to claim 18, wherein a crystalline grain density at a top of the first layer of oxygen-doped polysilicon is substantially the same as a crystalline grain density at a bottom of the first layer of oxygen-doped polysilicon, and wherein a crystalline grain density at a top of the first layer of polysilicon is substantially the same as a crystalline grain density at a bottom of the first layer of polysilicon.

20. The method of claim 15, wherein the diffusing further comprises introducing hydrogen gas into the chamber at a flow rate of 50 standard liters per minutes, wherein the introducing of the premixed gas and the introducing of the hydrogen gas yields 10 parts per million (PPM) oxygen, relative to hydrogen, within the chamber.

* * * * *